(12) United States Patent
Liu et al.

(10) Patent No.: US 9,198,334 B2
(45) Date of Patent: Nov. 24, 2015

(54) METAMATERIAL FOR DEFLECTING AN ELECTROMAGNETIC WAVE

(75) Inventors: Ruopeng Liu, Guangdong (CN); Guanxiong Xu, Guangdong (CN); Lin Luan, Guangdong (CN); Chunlin Ji, Guangdong (CN); Zhiya Zhao, Guangdong (CN); Yuefeng Li, Guangdong (CN); Yutao Yue, Guangdong (CN)

(73) Assignees: KUANG-CHI INNOVATIVE TECHNOLOGY LTD., FuTian District, Shenzhen, Guangdong (CN); KUANG-CHI INSTITUTE OF ADVANCED TECHNOLOGY, Nenshan District, Shenzhen, Guangdong (CN)

( * ) Notice: Subject to any disclaimer, the term of this patent is extended or adjusted under 35 U.S.C. 154(b) by 509 days.

(21) Appl. No.: 13/522,017

(22) PCT Filed: Nov. 18, 2011

(86) PCT No.: PCT/CN2011/082392
§ 371 (c)(1),
(2), (4) Date: Jul. 13, 2012

(87) PCT Pub. No.: WO2012/126249
PCT Pub. Date: Sep. 27, 2012

(65) Prior Publication Data
US 2013/0098673 A1   Apr. 25, 2013

(30) Foreign Application Priority Data

Mar. 18, 2011  (CN) .......................... 2011 1 0066154
Mar. 31, 2011  (CN) .......................... 2011 1 0081021

(51) Int. Cl.
| | |
|---|---|
| *H01Q 15/02* | (2006.01) |
| *H05K 9/00* | (2006.01) |
| *H01Q 15/00* | (2006.01) |
| *H05K 1/02* | (2006.01) |
| *H05K 3/46* | (2006.01) |

(52) U.S. Cl.
CPC .......... *H05K 9/0073* (2013.01); *H01Q 15/0086* (2013.01); *H05K 1/024* (2013.01); *H05K 1/0236* (2013.01); *H05K 3/4694* (2013.01); *H05K 2201/09972* (2013.01)

(58) Field of Classification Search
CPC .................................................. H01Q 15/0086
USPC .......................................... 343/909, 700 MS
See application file for complete search history.

(56) References Cited

U.S. PATENT DOCUMENTS

| | | | |
|---|---|---|---|
| 2008/0165079 A1* | 7/2008 | Smith et al. | 343/911 R |
| 2010/0066639 A1* | 3/2010 | Ngyuen et al. | 343/911 R |
| 2010/0118412 A1* | 5/2010 | Sanada | 359/642 |
| 2010/0141358 A1* | 6/2010 | Akyurtlu et al. | 333/219.1 |
| 2010/0225563 A1* | 9/2010 | Lin et al. | 343/909 |
| 2010/0301971 A1* | 12/2010 | Yonak et al. | 333/219.1 |

* cited by examiner

*Primary Examiner* — Dieu H Duong
(74) *Attorney, Agent, or Firm* — Winston Hsu; Scott Margo

(57) ABSTRACT

A metamaterial for deflecting an electromagnetic wave is disclosed, which comprises a functional layer. The functional layer comprises a plurality of sheet layers parallel to each other, and each of the sheet layers comprises a sheet-like substrate and a plurality of man-made microstructures arranged in an array on the sheet-like substrate. The sheet-like substrate comprises a plurality of unit blocks, and each of the man-made microstructures and a corresponding one of the unit blocks occupied thereby form a unit cell. Refractive indices of the unit cells arranged in a first direction in each of the sheet layers decrease gradually. Each of the unit cells has an anisotropic electromagnetic parameter. Through use of the metamaterial of the present disclosure, deflection of the electromagnetic wave can be achieved.

12 Claims, 13 Drawing Sheets

METAMATERIAL FOR DEFLECTING AN ELECTROMAGNETIC WAVE

FIELD OF THE INVENTION

The present disclosure generally relates to the technical field of electromagnetic communications, and more particularly, to a metamaterial for deflecting an electromagnetic wave.

BACKGROUND OF THE INVENTION

The communication industry mainly relies on use of electromagnetic waves for detection, positioning, communications and the like. The electromagnetic waves can be separated, converged, deflected and diverged by different materials or devices. Materials capable of deflecting an electromagnetic wave (i.e., changing a propagating direction of the electromagnetic wave) are mainly inhomogenous materials; that is, inhomogeneity of the materials leads to unbalance in distribution of the refractive indices. Specifically, differences in densities or species of materials can all lead to variations of the refractive indices.

Prior art inhomogenous materials for deflecting an electromagnetic wave are usually formed by laminating multiple layers of materials having different refractive indices together. According to such properties as the frequency and the wavelength of the electromagnetic wave to be deflected, a refractive index distribution of the inhomogeneous material can be designed, and then appropriate materials having corresponding refractive indices can be chosen in individual distribution regions.

This kind of material for deflecting an electromagnetic wave is disadvantageous in that, the refractive indices of currently available materials are inherent and cannot be designed arbitrarily. If refractive indices in some regions of the desired refractive index distribution cannot be obtained from natural materials currently available, the inhomogenous material as a whole will fail to satisfy the desired deflecting requirements.

Metamaterials refer to man-made composite structures or composite materials having supernormal physical properties that natural materials lack. Through structurally ordered design of critical physical dimensions of the materials, restrictions of some apparent natural laws can be overcome to obtain supernormal material functions that natural materials lack.

For conventional metamaterials, dielectric constants and magnetic permeabilities thereof at different points are changed primarily by periodically arranging different man-made metal microstructures on a substrate. However, arranging the man-made metal microstructures on the metamaterial substrate is not the sole way of changing the dielectric constants and the magnetic permeabilities of different points of the metamaterials to achieve different functions, and arranging the man-made metal microstructures on the metamaterial substrate requires use of a complex process, which is difficult to be implemented.

SUMMARY OF THE INVENTION

In view of the shortcoming of the prior art inhomogeneous materials that the refractive indices thereof cannot be designed arbitrarily and therefore, they cannot satisfy requirements of deflecting an electromagnetic wave in some special cases, an objective of the present disclosure is to provide a metamaterial that allows for arbitrary design of refractive indices and that is suitable for use in various application conditions.

To achieve the aforesaid objective, the present disclosure provides a metamaterial for deflecting an electromagnetic wave, which comprises a functional layer. The functional layer comprises a plurality of sheet layers parallel to each other, each of the sheet layers comprises a sheet-like substrate and a plurality of man-made microstructures arranged in an array on the sheet-like substrate or a plurality of pores formed in the sheet-like substrate. The sheet-like substrate comprises a plurality of unit blocks. Each of the man-made microstructures or each of the pores and a corresponding one of the unit blocks occupied thereby form a unit cell, refractive indices of the unit cells arranged in a first direction in each of the sheet layers vary gradually, and each of the unit cells has an anisotropic electromagnetic parameter.

Preferably, the refractive indices of the unit cells arranged in the first direction in each of the sheet layers decrease gradually, the refractive indices of the unit cells arranged in a second direction, which is perpendicular to the first direction, in each of the sheet layers are identical to each other or decrease gradually, and the refractive indices of the unit cells arranged in a third direction, which is perpendicular to a surface of the sheet layer, are identical to each other or decrease gradually.

Preferably, the man-made microstructures in each of the sheet layers have a same pattern as each other, sizes of the man-made microstructures arranged in the first direction decrease gradually, sizes of the man-made microstructures arranged in the second direction in each of the sheet layers are identical to each other or decrease gradually, and sizes of the man-made microstructures arranged in the third direction in each of the sheet layers are identical to each other or decrease gradually.

Preferably, each of the man-made microstructures has a pattern that is non-90° rotationally symmetrical, and is of a two-dimensional (2D) "I" form or a 2D snowflake form.

Preferably, each of the man-made microstructures is formed of wires that form a geometric pattern, and both numbers and sizes of the wires attached on the sheet-like substrate decrease gradually in the first direction so that the refractive indices of the unit cells arranged in the first direction in each of the sheet layers decrease gradually.

Preferably, all the man-made microstructures are identical to each other, and numbers of the man-made microstructures attached on each of the sheet-like substrates are not totally identical to each other.

Preferably, each of the man-made microstructures is of a two-dimensional "工" form, which comprises two first metal wires parallel to and equal in length to each other, and a second metal wire connected at both ends to the two first metal wires respectively and perpendicular to the first metal wires.

Preferably, each of the man-made microstructures is a "+" form, an annular ring with a notch or a closed curve.

Preferably, each of the man-made microstructures is of a 3D structure, which comprises three orthogonal metal wires perpendicular to each other and intersect with each other at a point and end metal wires connected perpendicularly to both ends of each of the orthogonal metal wires respectively.

Preferably, optical axes of the unit cells arranged in the first direction in each of the sheet layers are parallel to each other or rotated sequentially with respect to each other.

Preferably, for the unit cells arranged in the first direction, ratios of a volume of the pores in each of the unit cells to a volume of the respective unit cell vary gradually and the pores are filled with a same medium so that the refractive indices of the unit cells arranged in the first direction in each of the sheet layers vary gradually.

Preferably, each of the unit cells is formed with one said pore, and sizes of the pores of the unit cells arranged in the first direction vary gradually.

Preferably, each of the unit cells is formed with a plurality of said pores that have a same volume, and the refractive indices of the unit cells arranged in the first direction vary gradually.

Preferably, a refractive index of the medium filled in the pores is smaller than a refractive index of the sheet-like substrate, and a variation tendency of the ratios of the volume of the pores in each of the unit cells to the respective unit cell for the unit cells arranged in the first direction is opposite to a variation tendency of the refractive index of the metamaterial as a whole.

Preferably, a refractive index of the medium filled in the pores is greater than a refractive index of the sheet-like substrate, and a variation tendency of the ratios of the volume of the pores in each of the unit cells to the respective unit cell for the unit cells arranged in the first direction is identical to a variation tendency of the refractive index of the metamaterial as a whole.

Preferably, for the unit cells arranged in the first direction, ratios of a volume of the pores in each of the unit cells to a volume of the respective unit cell are identical to each other and the pores are filled with different media so that the refractive indices of the unit cells arranged in the first direction in each of the sheet layers vary gradually.

Preferably, refractive indices of the media filled in the pores of the unit cells arranged in the first direction vary gradually.

Preferably, a size of each of the unit cells is smaller than one fifth of the wavelength of the electromagnetic wave to be deflected.

Preferably, the metamaterial for deflecting an electromagnetic wave further comprises an impedance matching layer disposed on an incident surface and/or an exiting surface of the functional layer; and the sheet-like substrate is made of a ceramic material, a polymer material, a ferro-electric material or a ferrite material.

The metamaterial for deflecting an electromagnetic wave of the present disclosure has the following benefits: the metamaterial technologies are adopted to achieve deflection of the electromagnetic wave. The metamaterial is formed of a plurality of sheet layers, and by changing the man-made microstructures of each of the sheet layers, refractive indices of corresponding portions can be changed. Therefore, through overall design of the forms and structures of the man-made microstructures, refractive indices that change orderly can be obtained to form a man-made material with nonuniform refractive indices for deflecting the electromagnetic wave. Accordingly, the metamaterial of the present disclosure can satisfy requirements for deflecting various electromagnetic waves through different designs and arrangements of the man-made microstructures. Moreover, by virtue of the anisotropy of the unit cells, the exiting position of the electromagnetic wave can be controlled by rotating the optical axes of the unit cells.

BRIEF DESCRIPTION OF THE DRAWINGS

To describe the technical solutions of embodiments of the present disclosure more clearly, the attached drawings necessary for description of the embodiments will be introduced briefly hereinbelow. Obviously, these attached drawings only illustrate some of the embodiments of the present disclosure, and those of ordinary skill in the art can further obtain other attached drawings according to these attached drawings without making inventive efforts. In the attached drawings.

DETAILED DESCRIPTION OF THE INVENTION

Hereinbelow, a first embodiment and a second embodiment of the present disclosure will be detailed with reference to FIG. 1 to FIG. 6.

"Metamaterials" refer to man-made composite structures or composite materials having supernormal physical properties that natural materials lack. Through structurally ordered design of critical physical dimensions of the materials, restrictions of some apparent natural laws can be overcome to obtain supernormal material functions that natural materials lack.

A "metamaterial" has the following three important features:

(1) the "metamaterial" is usually a composite material having a novel man-made structure;

(2) the "metamaterial" has supernormal physical properties (which are often properties that natural materials lack); and (3) properties of the "metamaterial" are determined jointly by the intrinsic nature of the constitutional material and the man-made microstructures formed therein.

The present disclosure provides a metamaterial for deflecting an electromagnetic wave, which is detailed as follows.

Figure 1:
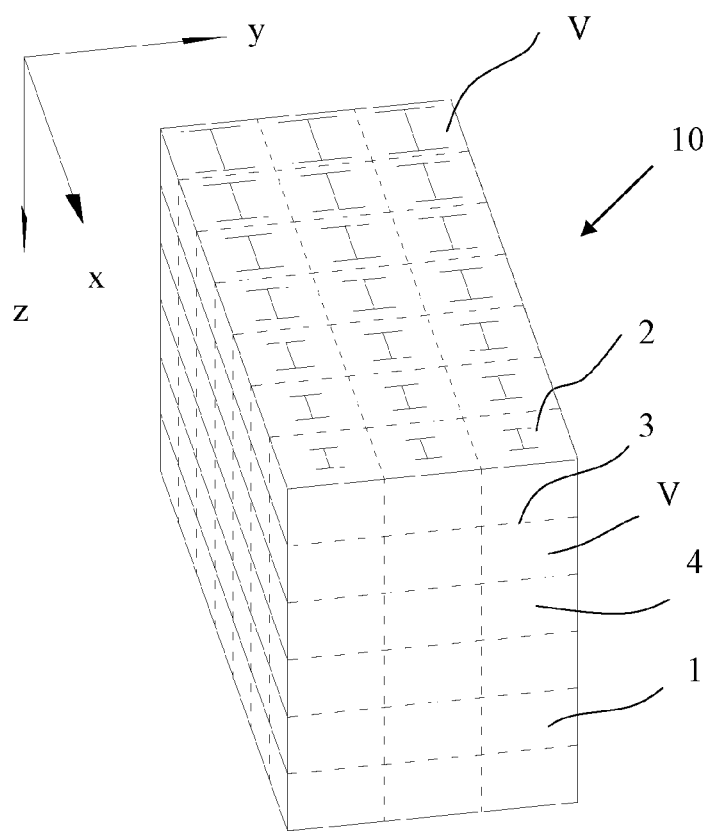
FIG. 1 is a schematic structural view of a functional layer of a metamaterial for deflecting an electromagnetic wave according to the present disclosure.

As shown in FIG. 1, a metamaterial for deflecting an electromagnetic wave according to the present disclosure comprises a functional layer 10, which comprises a plurality of sheet layers 1 parallel to each other. Each of the sheet layers 1 comprises a sheet-like substrate 2 and a plurality of man-made microstructures 3 arranged in an array on the sheet-like substrate. The sheet-like substrate 2 is divided into a plurality of unit blocks V, and each of the man-made microstructures 3 and a corresponding unit block V occupied thereby form a unit cell 4. A plurality of unit cells 4 arranged in a first direction in each of the sheet layers 1 has refractive indices that decrease gradually, and each of the unit cells 4 has an anisotropic electromagnetic parameter. The unit blocks may be identical to each other in the form of either a cube or a cuboid. The length, the width and the height of each of the unit blocks V range between one tenth and one fifth of a wavelength of the incident electromagnetic wave. By "each of the unit cells 4 has an anisotropic electromagnetic parameter", it means that refractive indices of different points in the unit cell space are not all the same as each other, but are distributed in an ellipsoid form (which is called a refractive index ellipsoid). For any given unit cell, the refractive index ellipsoid thereof may be calculated through prior art simulation software and calculation methods. In FIG. 1, the first direction refers to the x direction shown in this drawing.

In case of a 2D man-made microstructure, the isotropy means that, for any electromagnetic wave incident at any angle on the 2D plane, the electric field response and the magnetic response of the man-made microstructure are all the same in this plane (i.e., the dielectric constant and the magnetic permeability are kept constant); and in case of a 3D man-made microstructure, the isotropy means that, for any electromagnetic wave incident at any angle in the 3D space, the electric field response and the magnetic response of the man-made microstructure are all the same in this 3D space. A man-made microstructure has the isotropy property when it has a 90° rotationally symmetric structure.

For a 2D structure, "a 90° rotationally symmetric structure" means that, when being rotated by 90° arbitrarily in the 2D plane about a rotation axis that is perpendicular to the 2D plane and passes through a symmetry center thereof, the structure will coincide with the original structure. For a 3D structure, if the structure has three rotation axes that are perpendicular to each other and intersect with each other at a common point (i.e., a center of rotation) so that, after being rotated by 90° about any of the rotation axes, the structure will coincide with or be symmetric with the original structure with respect to an interface, then the structure is called a 90° rotationally symmetric structure.

Correspondingly, if a man-made microstructure is not a 90° rotationally symmetric (non-90° rotationally symmetric) structure either in the 2D plane or in a 3D space, then it is anisotropic (either in the 2D plane or in the 3D space).

Figure 2:
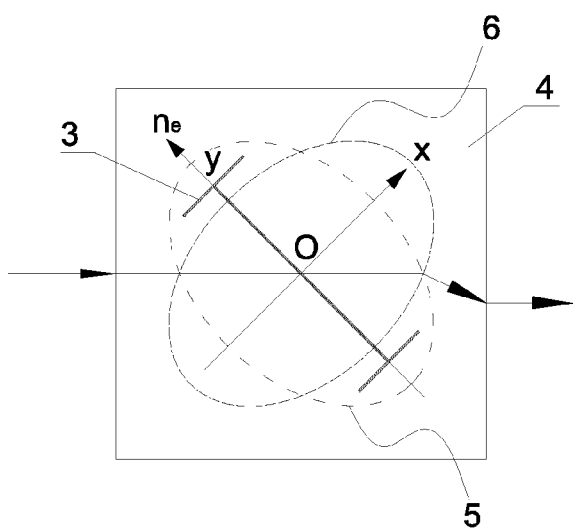
FIG. 2 is a schematic cross-sectional view of a refractive index ellipsoid in an xy plane.

FIG. 2 is a schematic cross-sectional view of a refractive index ellipsoid in an xy plane in the incident direction of the electromagnetic wave (taking a man-made microstructure of an "I" form as an example). This cross section is of an ellipse form, in which an ne axis represents an optical axis of the refractive index ellipsoid 5. Assume that an origin O of coordinates of the 2D plane is located at a center of the refractive index ellipsoid, the ne axis is taken as a y axis, a direction perpendicular to the y axis is taken as an x axis, and any point of the refractive index ellipsoid on the xy plane is represented by nx, ny. Then, as a general knowledge, two components of the propagation constant k of a light wave propagating through the refractive index ellipsoid in the y direction and in the x direction are $k_y = n_x \omega/c$ and $k_x = n_y \omega/c$ respectively. Here, $\omega$ represents the angular frequency, and c represents the light speed. Through a coordinate conversion, we can know that the propagation constant k also presents an elliptical distribution in the unit cell, and the elliptical form is the same as but is orthogonal to the ellipse of the refractive index ellipsoid in the xy plane. Likewise, we can know that the propagation constant k presents an ellipsoidal distribution in the 3D space, in which case the ellipsoidal form is the same as but is orthogonal to the refractive index ellipsoid. The ellipsoid of the propagation constant k is defined as a wave propagation ellipsoid 6. As can be known, the wave propagation ellipsoid 6 has the same form (but not necessarily the same size) as the refractive index ellipsoid 5, with a major axis direction of the wave propagation ellipsoid 6 corresponding to a minor axis direction of the refractive index ellipsoid and a minor axis direction of the wave propagation ellipsoid 6 corresponding to a major axis direction of the refractive index ellipsoid. The x and y axes in FIG. 2 are defined only for purpose of deriving the wave propagation ellipsoid 6, and are different from those in other attached drawings.

A deflected direction of the electromagnetic wave after passing through the unit cell 4 can be drawn in the wave propagation ellipsoid. As shown in FIG. 2, the electromagnetic wave incident in the direction as shown in FIG. 2 intersects with a surface of the wave propagation ellipsoid 6 at a point. A tangent to the wave propagation ellipsoid 6 is made at this intersection point, and a direction normal to the tangent at the intersection point is just a propagation direction of the energy s of the electromagnetic wave (i.e., the energy s of the electromagnetic wave propagates in this direction within the metamaterial). When the electromagnetic wave travels in this direction until it exits from the metamaterial, the normal line extends to a surface of the electromagnetic wave splitting element (i.e., the exiting surface). Then, the electromagnetic wave continues to exit from an intersection point on the exiting surface in a direction parallel to the incident direction. The exiting direction is the phase propagation direction of the electromagnetic wave. That is to say, the anisotropic metamaterial can change the energy propagation direction of the electromagnetic wave passing therethrough, but will not change the phase propagation direction thereof, so the electromagnetic wave is actually translated when exiting. Of course, the premise is that the refractive indices of the metamaterial are uniformly distributed (i.e., each of the unit cells has the same refractive index ellipsoid).

In case of a metamaterial having a nonuniform refractive index distribution and anisotropic to the electromagnetic wave, the electromagnetic wave will experience a change in both the energy propagation direction and the phase propagation direction thereof after propagating through the metamaterial. The phase propagation direction is determined by the nonuniformity of the refractive indices, and the energy propagation direction is determined by the optical axis distribution of the anisotropic unit cells.

In the present disclosure, each of the sheet layers 1 has a front surface and a back surface parallel to each other, so each of the sheet layers 1 has a uniform thickness. As used in the present disclosure, a first direction refers to a column direction of the man-made microstructures 3 arranged in an array on each of the sheet layers 1, a second direction refers to a row direction of the array, and a third direction refers to a direction perpendicular to the surfaces of the sheet layer. In the attached drawings except for FIG. 2, the first direction, the second direction and the third direction are represented by the x axis, the y axis and the z axis of a 3D coordinate system respectively.

The change in propagation direction of the electromagnetic wave may be represented by the refractive index. As is known, the refractive index $n=\sqrt{\mu\in}$, where $\mu$ represents the magnetic permeability and $\in$ represents the dielectric constant. It has been proved through experiments that, the electromagnetic wave deflects in a direction towards a greater refractive index when propagating through a metamaterial. Thus, a desired refractive index can be obtained by changing the dielectric constant $\in$ with the magnetic permeability $\mu$ remaining unchanged. Therefore, by reasonably designing the dielectric constant of each of the unit cells in the functional layer 10, any desirable deflecting effect can be obtained.

Figure 3:
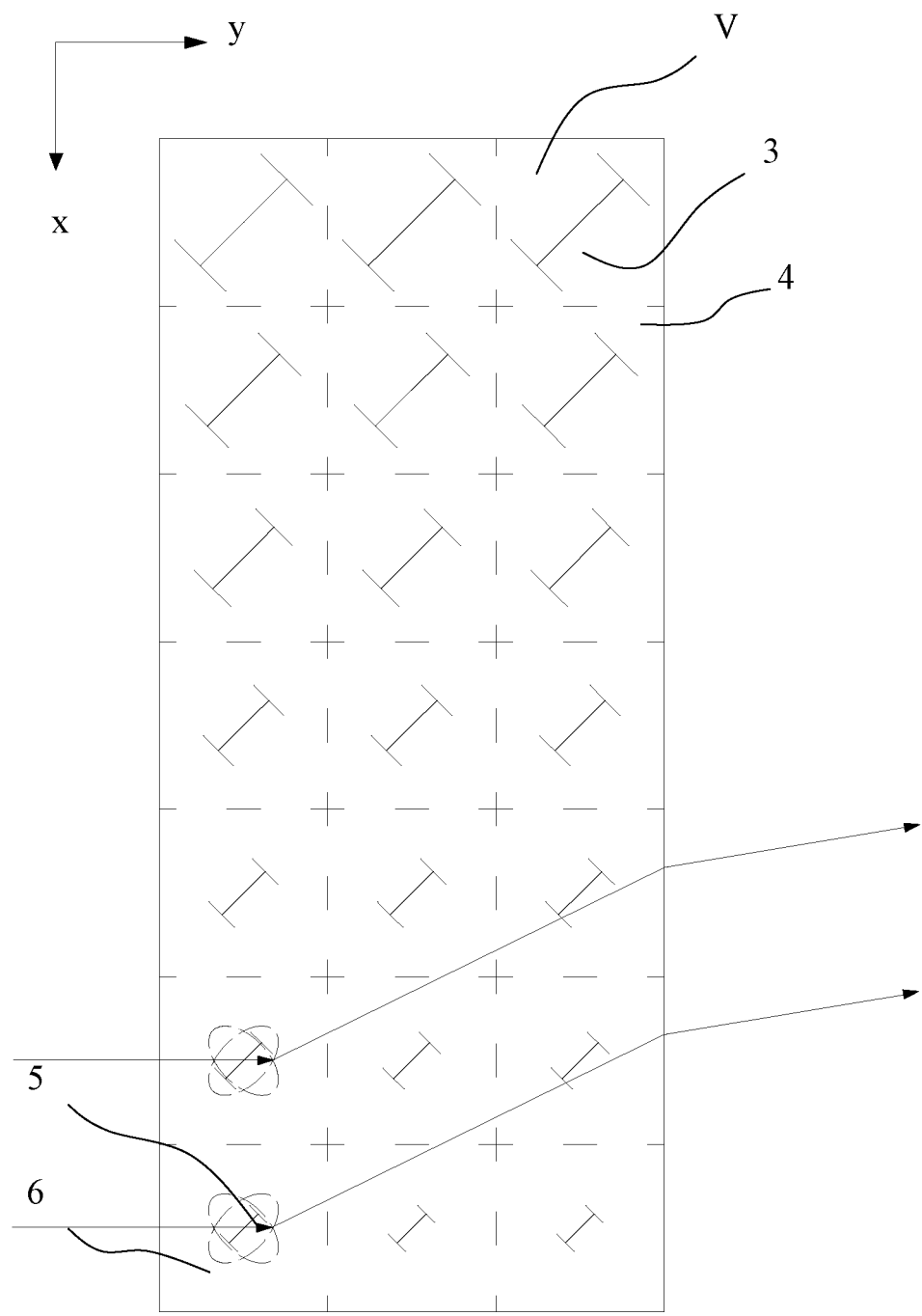
FIG. 3 is a schematic structural view of a functional layer of a metamaterial according to a first embodiment of the present disclosure.

FIG. 3 is a schematic structural view of a functional layer 10 of a metamaterial according to a first embodiment of the present disclosure. The man-made microstructures 3 are each a metal microstructure of an "I" form. The man-made microstructures 3 on each of the sheet layers 1 of the functional layer 10 are arranged in an array, and all have the same pattern of the "I" form. The man-made microstructures 3 arranged in the y direction decrease in size gradually, while the man-made microstructures 3 arranged in the x direction remain constant. As is known from experiments, for metal microstructures of the same pattern, the dielectric constants exhibited in the same unit cell is directly proportional to the sizes thereof. Therefore, in this embodiment, the regular distribution in size of the man-made microstructures actually also represents the regular distribution of the dielectric constants of the unit cells 4, and given that the magnetic permeability remains unchanged, also represents the regular distribution of the refractive indices of the unit cells. Therefore, in this embodiment, the refractive indices of the unit cells 4 in each column decrease gradually in the y direction, and refractive index of the unit cells 4 remains constant in the x direction.

Furthermore, in this embodiment, the man-made microstructures 3 of the unit cells 4 arranged in the z direction also have a constant size, so the unit cells 4 arranged in the z direction also have a constant refractive index.

Meanwhile, in this embodiment, the optical axes of all the unit cells 4 are parallel to each other and include a non-zero angle with the x direction. Because the optical axis is just the minor-axis direction of the wave propagation ellipsoid, it can be said that the minor-axis direction of the wave propagation ellipsoid includes a non-zero angle with the x direction.

In this embodiment, because the distribution of refractive indices is the same for each column of unit cells, each unit cell has an effect of deflecting the electromagnetic wave towards a same direction. After the electromagnetic wave propagates through a plurality of unit cells, the deflecting effect is accumulated; and because of the anisotropy of the unit cells, the exiting position of the electromagnetic wave can be controlled, i.e., by controlling the angle included between the optical axis and the x axis.

Figure 4:
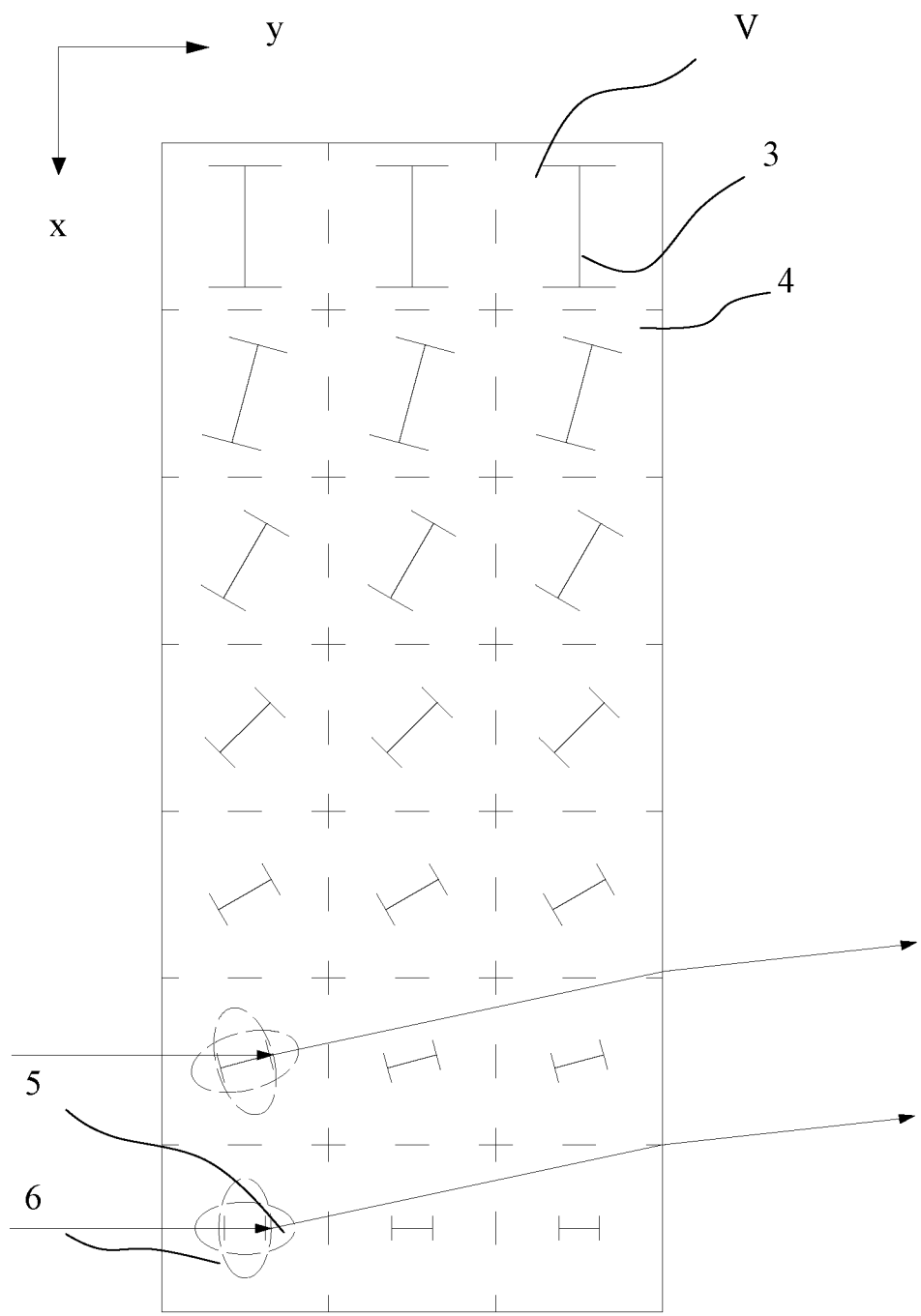
FIG. 4 is a schematic structural view of a functional layer of a metamaterial according to a second embodiment of the present disclosure.

FIG. 4 is a schematic structural view of a functional layer of a metamaterial according to a second embodiment of the present disclosure. This embodiment differs from the first embodiment in that, the optical axes of the unit cells 4 in each of the sheet layers 1 are not parallel to each other, but are rotated sequentially with respect to each other. As shown in FIG. 4, at a position where the refractive index is the greatest in the sheet layer 1, the optical axis (i.e., the minor-axis direction of the wave propagation ellipsoid shown in this figure) formes an angle of 0° with the x direction; and at a position where the refractive index is the smallest in the sheet layer 1, the optical axis includes an angle of 90° with the x direction. In this embodiment, because the distribution of refractive indices is the same for each column of unit cells, each unit cell has an effect of deflecting the electromagnetic wave towards a same direction. After the electromagnetic wave propagates through a plurality of unit cells, the deflecting effect is accumulated; and because of the anisotropy of the unit cells, the exiting position of the electromagnetic wave can be controlled, e.g., to converge the energy to a greater extent so as to concentrate the energy more intensively. That is, as compared to deflecting an electromagnetic wave simply by virtue of the nonuniformity of refractive indices (isotropic nonuniformity), deflecting the electromagnetic wave through use of the anisotropic deflecting technologies has additional effect: for example, the electromagnetic wave is made more divergent, more converged or, at the same time when the electromagnetic wave is deflected, the electromagnetic wave is split.

The sheet-like substrate 2 of the functional layer 10 of the present disclosure may be made of a ceramic material, a polymer material, a ferro-electric material, a ferrite material or a Ferro-magnetic material. The polymer material may be polytetrafluoroethylene (PTFE). PTFE has superior electrical insulation performances, so it will not interfere with the electric field of the electromagnetic wave; and moreover, PTFE has superior chemical stability, superior erosion resistance and a long service life, so it is a good choice for the substrate on which the metal microstructure are attached. Of course, composite materials such as FR-4 and F4b may also be chosen as the polymer material.

Preferably, the man-made microstructures of the present disclosure are metal microstructures, which are formed of metal wires (e.g., copper wires or silver wires) into a certain pattern. The metal wires may be attached on the sheet-like substrate through etching, electroplating, drilling, photolithography, electro etching or ion etching. Of course, the metal wires may also be attached on the sheet-like substrate through 3D laser processing.

Figure 6:
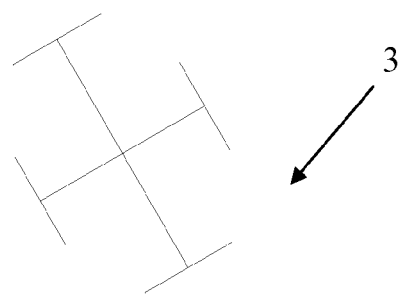
FIG. 6 is a schematic view of a 2D snowflake structure in a man-made microstructure according to the present disclosure.

Additionally, man-made microstructures of the "I" form, which is a simple anisotropic structure, are used in FIG. 1 to FIG. 4. Besides, the man-made microstructures of the present disclosure may also be of a 2D snowflake structure as shown in FIG. 6. Of course, man-made microstructures of any form can be used as long as they have the anisotropic property (i.e., a pattern that is non-90° rotationally symmetric).

As we know, an electromagnetic wave suffers from no loss when propagating in a same medium; however, when the electromagnetic wave propagates through an interface between different media, partial reflection will take place. Typically, the greater the difference in impedance of the media is, the stronger the reflection will be. The partial reflection of the electromagnetic wave leads to a corresponding energy loss of the electromagnetic wave in the propagation direction, which seriously affects the propagation distance and the signal quality of the electromagnetic wave.

Figure 5:
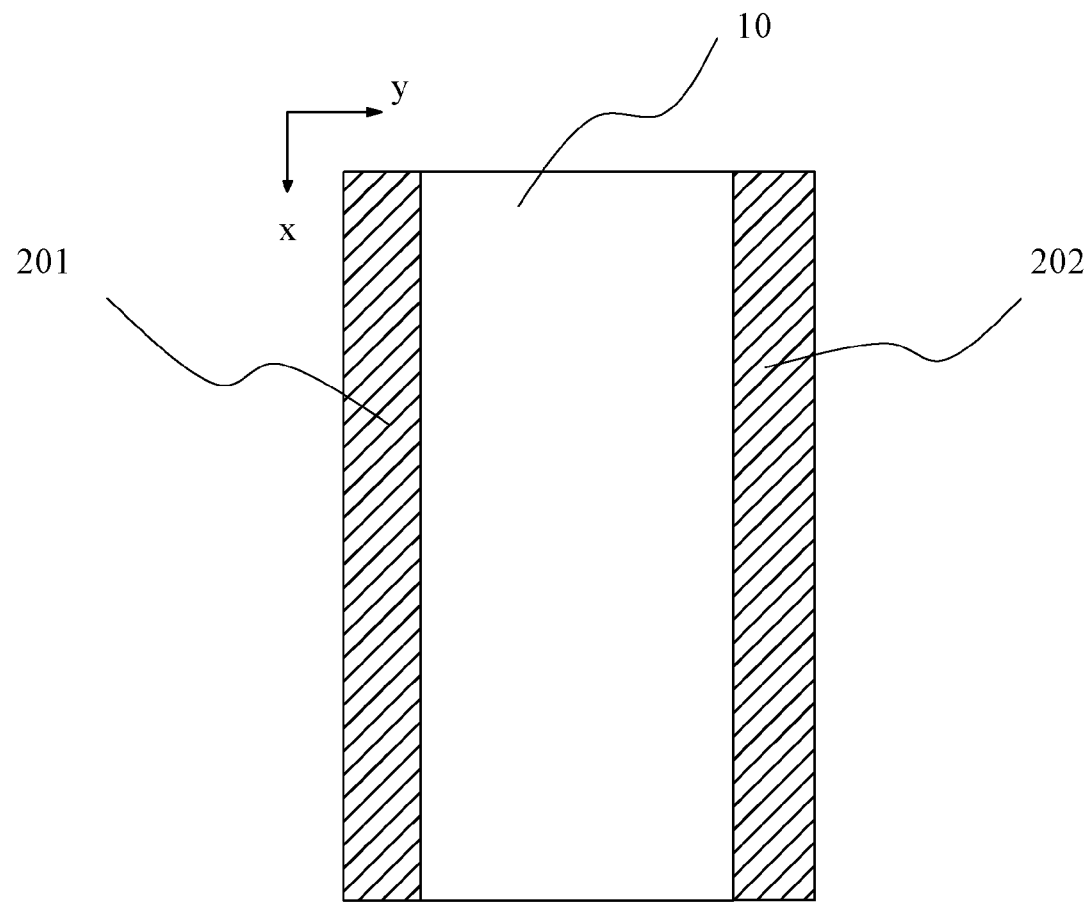
FIG. 5 is a schematic structural view of the metamaterial for deflecting an electromagnetic wave according to the present disclosure.

Therefore, as shown in FIG. 5, an impedance matching layer(s) may also be provided on the incident surface and/or the exiting surface of the functional layer 10 of the metamaterial in the aforesaid two embodiments. Preferably, the incident surface and the exiting surface are both provided with an impedance matching layer (201, 202). The present disclosure achieves the impedance matching in the following way: for the incident-side impedance matching layer 201, the impedance thereof at the side of the incident-side medium (e.g., air) is close to the impedance of the incident-side medium, and the impedance thereof at the side of the functional layer 10 is close to the impedance of the functional layer 10; and the impedance of the incident-side impedance matching layer 201 varies continuously in a direction perpendicular to the functional layer 10. For the exiting-side impedance matching layer 202, the impedance thereof at the side of the exiting-side medium (e.g., air) is close to the impedance of the exiting-side medium, and the impedance thereof at the side of the functional layer 10 is close to the impedance of the functional layer 10; and the impedance of the exiting-side impedance matching layer 202 varies continuously in a direction perpendicular to the functional layer 10. As we know, the greater the difference in impedance of the different media is, the stronger the reflection will be. Therefore, through use of the impedance matching layers (201, 202), abrupt transitions in impedance can be eliminated to avoid reflection of the electromagnetic wave at the interface between different media and the energy loss of the electromagnetic wave.

The impedance matching layers may also be made of a metamaterial having a structure similar to the functional layer. Of course, the impedance matching layers may also be made of other materials having similar functions. Additionally, the "impedance" described herein refers to the wave impedance.

As can be known from the formula that the impedance $Z=\sqrt{\mu/\in}$, the impedance may be changed by changing the ratio of the magnetic permeability to the dielectric constant. Thus, given that the magnetic permeability of the impedance matching layer is distributed uniformly, a desirable impedance distribution within the impedance matching layer can be achieved by adjusting the distribution of dielectric constants; that is to say, the impedance distribution within the impedance matching layer can be designed as desired.

Hereinbelow, a third embodiment and a fourth embodiment of the present disclosure will be detailed with reference to FIG. 7 to FIG. 11.

The metamaterial as a whole may be considered to be formed by stacking a plurality of cubic structure units in the x-y-z directions. Because the metamaterial itself shall have an effect on the electromagnetic wave, the size of each of the cubic structure units are required to be smaller than one fifth of a wavelength of the corresponding electromagnetic wave. Preferably, the cubic structure units all have the same size, which is one tenth of a wavelength of the corresponding electromagnetic wave.

The response of the metamaterial to an electromagnetic field is mainly determined by responses of the individual cubic structure units to the electromagnetic field. When there is a large enough number of cubic structure units, the responses of the individual cubic structure units to the electromagnetic field will be accumulated to macroscopically change physical properties of the incident electromagnetic wave.

As will be appreciated by those of ordinary skill in the art, an electromagnetic wave incident on a medium will deflect in a direction toward a greater refractive index in the medium. Therefore, in order to deflect the electromagnetic wave, the metamaterial for deflecting an electromagnetic wave of the present disclosure shall have refractive indices that gradually vary in at least one direction; for example, the refractive indices vary gradually in the x direction, and remain constant or also vary gradually in either of the y direction and the z direction. To obtain a large deflection angle, the refractive indices must vary at a large variation rate in this direction. By "decrease gradually" described herein, it means that data of the next reference point is smaller than or equal to data of the current reference point. By "a large variation rate" described herein, it means that among three contiguous reference points, a difference between the second reference point and the third reference point is greater than a difference between the first reference point and the second reference point. Herein, the refractive index is derived from the formula $n=\alpha\sqrt{\in\mu}$, where $\alpha$ is a constant, $\in$ is the dielectric constant of a metamaterial cubic structure unit at a certain electromagnetic wave frequency, and $\mu$ is the magnetic permeability of the metamaterial cubic structure unit at the electromagnetic wave frequency. By changing the dielectric constant and the magnetic permeability, the purpose of deflecting the electromagnetic wave can be achieved.

There are many ways to change the dielectric constants and magnetic permeabilities of individual points and, therefore, to deflect an electromagnetic wave. Hereinafter, two implementations capable of achieving the objective of the present disclosure will be detailed. Both the implementations explain the design principles of the present disclosure by taking the y direction as the first direction and by assuming that the refractive indices of the metamaterial decrease gradually in the y direction.

Figure 7:
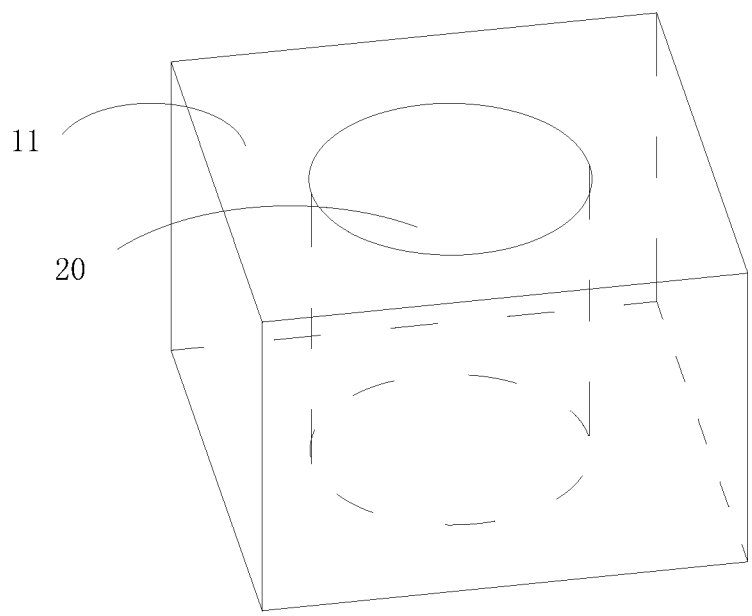
FIG. 7 is a schematic view of a cubic structure unit in a first implementation of the metamaterial for deflecting an electromagnetic wave according to a third embodiment of the present disclosure.
Figure 8:
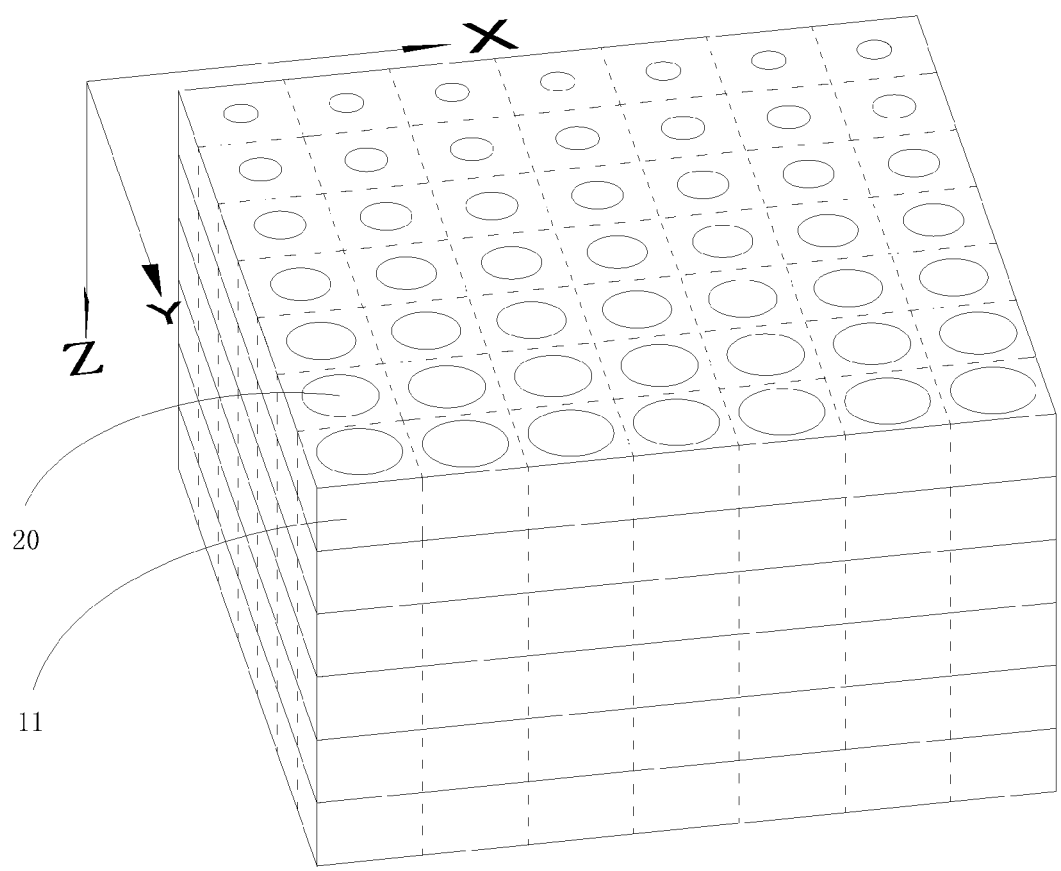
FIG. 8 is a schematic structural view of a metamaterial formed by stacking the cubic structure units as shown in FIG. 7 in x-y-z directions.
Figure 9:
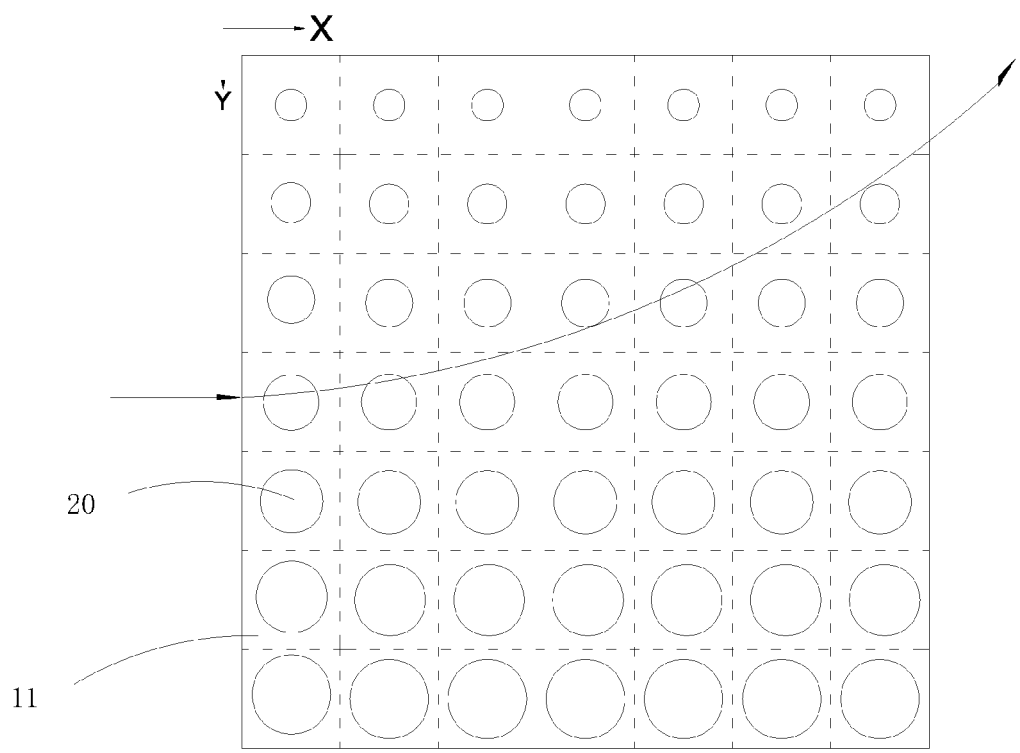
FIG. 9 is a front view of the metamaterial shown in FIG. 8.

Referring to FIG. 7, FIG. 8 and FIG. 9, FIG. 7 is a schematic view of a cubic structure unit of the metamaterial for deflecting an electromagnetic wave according to the third embodiment of the present disclosure, FIG. 8 is a schematic structural view of a metamaterial formed by stacking cubic structure units as shown in FIG. 7 in the x-y-z directions, and FIG. 9 is a front view of the metamaterial shown in FIG. 8. As shown in FIG. 9, the cubic structure unit comprises a substrate 11 and a pore 20 formed in the substrate 11. The pore 20 may be either a through-hole or not, but occupies a certain volume in the substrate 11 in both cases. In the metamaterial of this embodiment, a ratio of the volume of the pore 20 formed in the substrate 11 to the volume of the substrate 11 increases gradually in the y direction and remains constant in the x direction and the z direction, so the refractive indices decrease gradually in the y direction. Therefore, after the electromagnetic wave propagates through the metamaterial, the propagation direction thereof deflects towards a position where the refractive index is greater.

Additionally, the pores 20 may be filled with a medium to change the dielectric constants and the magnetic permeabilities of the respective cubic structure units. Because this embodiment changes the dielectric constants and the magnetic permeabilities by changing the ratio of the volume of the pore 20 to the volume of the cubic structure unit of each of the unit cells, the pores are filled with the same medium but the medium is different from that of the substrate. Specifically, the medium filled may be air, a ceramic material, a polymer material, a ferro-electric material or a ferrite material. In this embodiment, the medium filled is air. Because the refractive index of the air is definitely smaller than that of the substrate, the ratio of the volume of the pore 20 to the volume of the cubic structure unit still increases gradually in the y direction so that the refractive indices of the metamaterial as a whole decrease gradually in the y direction. However, when the medium filled in the pores 20 has a refractive index greater than that of the substrate, then the larger the volume of a pore 20 is, the greater the refractive index of the corresponding cubic structure unit will be. In the latter case, the ratio of the volume of the pore 20 to the volume of the cubic structure unit will decrease gradually in the y direction so that the refractive indices of the metamaterial as a whole increase gradually in the y direction.

There are many implementations for changing the ratio of the volume of the pore 20 to the volume of the cubic structure unit. What shown in FIG. 7, FIG. 8 and FIG. 9 is just a first implementation.

Figure 10:
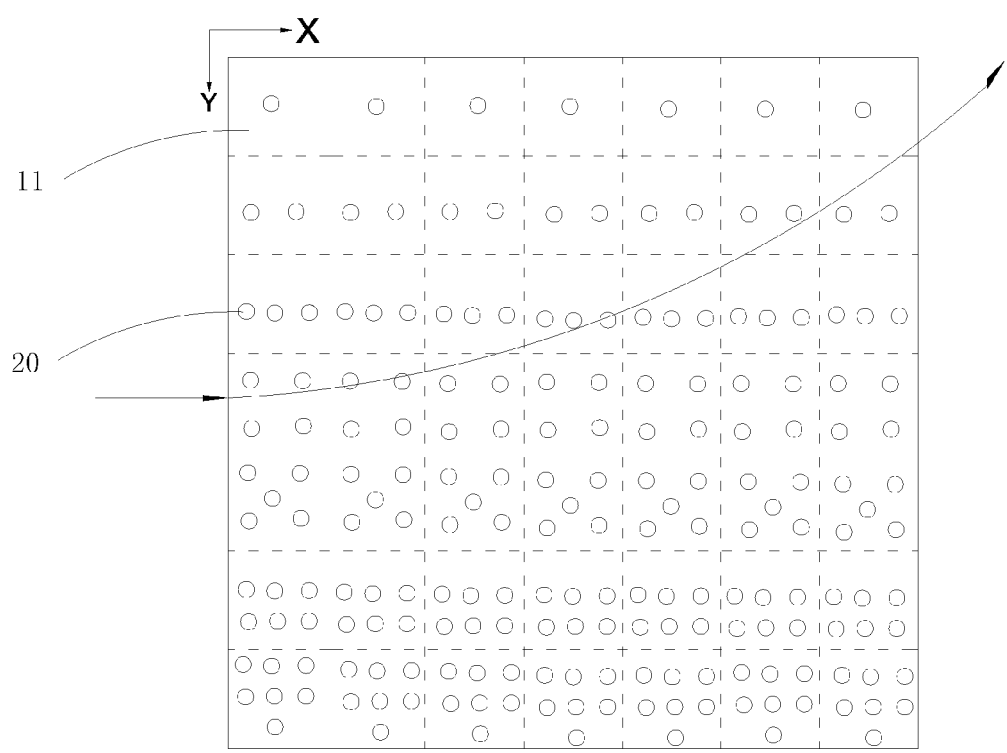
FIG. 10 is a front view of a second implementation of the metamaterial for deflecting an electromagnetic wave according to a third embodiment of the present disclosure.

FIG. 10 is a front view of a second implementation for changing the ratio of the volume of the pore 20 to the volume of the cubic structure unit. As shown, a plurality of pores 20 is formed in the substrate of the cubic structure units, and the number of pores 20 in each of the cubic structure units arranged in the y direction increases gradually so that the ratio of the volume of the pores 20 to the volume of the corresponding cubic structure unit increases correspondingly. The way of changing the ratio of the volume by changing the number of pores 20 makes it easier to adjust the refractive indices of the metamaterial and can save the molding cost of the drilling mold. Similar to the first implementation, a medium different from the substrate may still be filled in the pores 20. In this implementation, the medium filled is air. Because the refractive index of the air is definitely smaller than that of the substrate, the number of the pores 20 in each of the cubic structure units still increases gradually in the y direction so that the refractive indices of the metamaterial as a whole decrease gradually in the y direction. However, when the medium filled in the pores 20 has a refractive index greater than that of the substrate, then the larger the number of the pores 20 is, the greater the refractive index of the corresponding cubic structure unit will be. In the latter case, the number of the pores 20 in each of the cubic structure units will decrease gradually in the y direction so that the refractive indices of the metamaterial as a whole increase gradually in the y direction.

Conceivably, the cross-sectional pattern of each of the pores 20 is not necessarily the circular pattern shown in FIG. 9 and FIG. 10, but may also be a square pattern, a triangular pattern, a trapezoidal pattern or the like as long as it complies with the design concepts of this embodiment (i.e., to make the ratio of the volume of the pores 20 to the volume of the corresponding cubic structure unit vary gradually in a direction).

Likewise, deflecting of the electromagnetic wave in the x direction and in the y direction can be achieved by simply applying the variation tendency of the pores 20 to these directions respectively.

Figure 11:
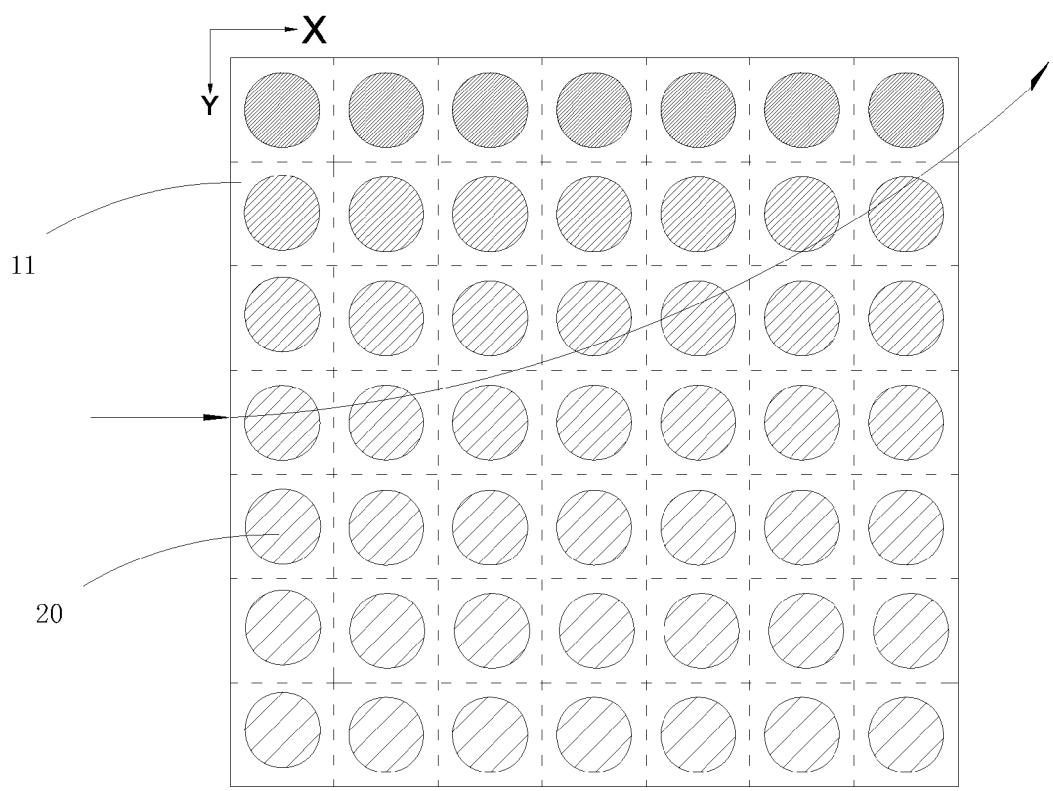
FIG. 11 is a front view of the metamaterial for deflecting an electromagnetic wave according to a fourth embodiment of the present disclosure.

FIG. 11 is a front view of the metamaterial for deflecting an electromagnetic wave according to a fourth embodiment of the present disclosure. In this embodiment, the ratio of the volume of the pore(s) 20 to the volume of the corresponding cubic structure unit remains constant for all the cubic structure units. The number, the size and the cross-sectional pattern of the pores 20 may be either the same or different for each of the cubic structure units so long as the ratio of the volume of the pore(s) 20 to the volume of the corresponding cubic structure unit remains constant for all the cubic structure units. In this embodiment, a case in which each of the cubic structure units has only one pore 20 and all the pores have the same size and the same circular cross-sectional pattern will be described as a preferred implementation. In such an implementation, the y direction is still taken as the first direction, and only a case in which the refractive indices decrease gradually in the y direction will be described. Implementations in which the refractive indices decrease gradually in the x direction, in the z direction or in all the three directions will be readily devised according to the description of this implementation.

Because the ratio of the volume of the pore 20 to the volume of the corresponding cubic structure unit remains constant for each of the cubic structure units in this implementation, different media have to be filled in the pores 20 of the cubic structure units arranged in the y direction to change the dielectric constants and the magnetic permeabilities of the cubic structure units. In order to make the refractive indices decrease gradually in the y direction, the pores 20 of each column of the cubic structure units arranged in the y direction must be filled with media of which the dielectric constants and the magnetic permeabilities both decrease gradually. For example, an iodine crystal, a copper oxide, a quartz crystal, quartz, polystyrene, sodium chloride, glass and air are filled in sequentially. In FIG. 11, hachures are used to represent the media filled, and the larger the density of the hachures is, the greater the refractive index of the medium filled will be.

Various feasible embodiments may be obtained through combinations of the implementations of the third embodiment and the implementations of the fourth embodiment. For example, in an embodiment, the ratio of the volume of the pore(s) 20 to the volume of the corresponding cubic structure unit is different for each of the cubic structure units, and meanwhile, the pores 20 are filled with media having different refractive indices.

Hereinbelow, a fifth embodiment to a ninth embodiment of the present disclosure will be detailed with reference to FIG. 12 to FIG. 18.

Figure 12:
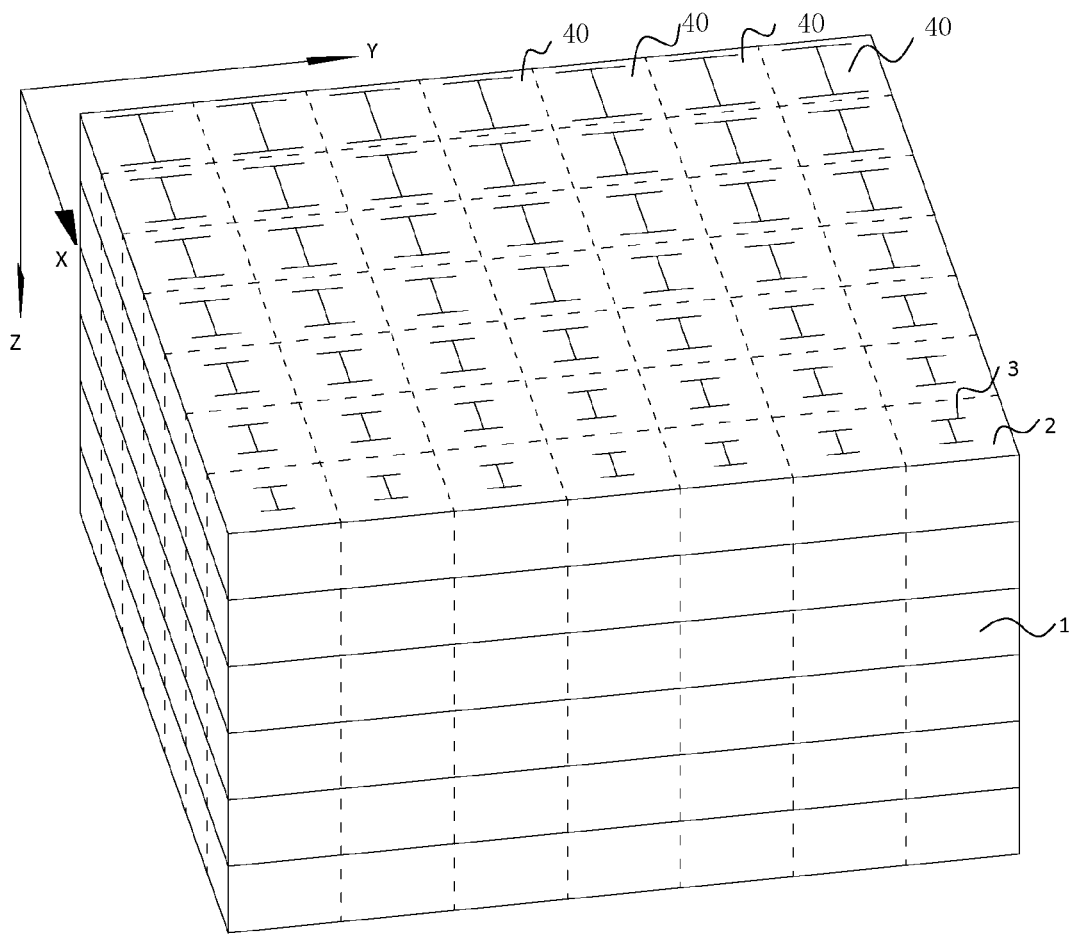
FIG. 12 is a schematic structural view of the metamaterial for deflecting an electromagnetic wave according to a fifth embodiment of the present disclosure.

The present disclosure relates to a metamaterial for deflecting an electromagnetic wave that is capable of deflecting a propagation direction of the electromagnetic wave. As shown in FIG. 12, the metamaterial comprise at least one metamaterial sheet layer. When there is more than one metamaterial sheet layer, the metamaterial sheet layers are stacked in a direction perpendicular to a surface of each sheet layer and then assembled or connected together to form a complete 3D metamaterial.

As shown in FIG. 12, each of the sheet layers comprises a sheet-like substrate 2 and a plurality of man-made microstructures 3 attached on the substrate 2. The sheet-like substrate 2 has a front surface and a back surface parallel to each other, so it has a uniform thickness. Two directions orthogonal to each other are defined in any plane parallel to the front surface of the sheet-like substrate 2, namely, a first direction x and a second direction y; and a direction perpendicular to the surface of the sheet-like substrate 2 (i.e., the direction in which the metamaterial sheet layers 1 are stacked) is defined as the third direction z.

The man-made microstructures 3 attached on the substrate 2 include two kinds: one is 2D man-made microstructures 3 that are attached on the front surface of the substrate 2; and the other is 3D man-made microstructures that are attached inside the sheet-like substrate 2. Each of the man-made microstructures 3 generally consists of metal wires (e.g. silver wires or copper wires) or non-metal wires. These wires are engraved on the surface of or inside the substrate to form a certain geometric pattern. The substrate 2 is divided into a multitude of equal cubic substrate units, e.g., cubes whose length, width and height are all one tenth of the wavelength of the electromagnetic wave, with a certain number of man-made microstructures 3 being attached on each of the substrate units to form a metamaterial unit 40. Therefore, each of the metamaterial units 40 comprises a certain number of wires of which the man-made microstructures 3 are formed.

As is known, an electromagnetic wave incident on a medium will deflect in a direction toward a greater refractive index in the medium. Therefore, in order to deflect the electromagnetic wave, the metamaterial for deflecting an electromagnetic wave of the present disclosure shall have refractive indices that decrease gradually in at least one direction; for example, the refractive indices decrease gradually in the x direction, and remain constant or also decrease gradually in either of the y direction and the z direction. To obtain a large deflection angle, the refractive indices must decrease at a large variation rate in this direction. By "decrease gradually" described herein, it means that data of next reference point is smaller than or equal to data of the current reference point. By "a large variation rate" described herein, it means that among three contiguous reference point, a difference between the second reference point and the third reference point is greater than a difference between the first reference point and the second reference point.

Herein, the refractive index is derived from the formula $n=\alpha\sqrt{\in\mu}$, where $\alpha$ is a constant, $\in$ is the dielectric constant of a metamaterial unit 40 at a certain electromagnetic wave frequency, and $\mu$ is the magnetic permeability of the metamaterial unit 40 at the electromagnetic wave frequency.

It has been found through numerous experiments and simulations that, positions having a larger wire density on the substrate 2 (i.e., positions having a higher wire content in the substrate units) exhibit a greater equivalent refractive index. Therefore, in order to decrease the refractive indices gradually in the x direction, the wire content in the substrate units shall decrease gradually at least in the x direction. Here, a substrate unit may be measured in a conventional unit of volume such as cubic millimeters, cubic centimeters or the like, or in units of any user-defined volume size. For example, each of the aforesaid metamaterial units 40 forms a substrate unit, and the whole metamaterial sheet layer 1 is comprised of tens of thousands of such metamaterial units 40.

Figure 13:
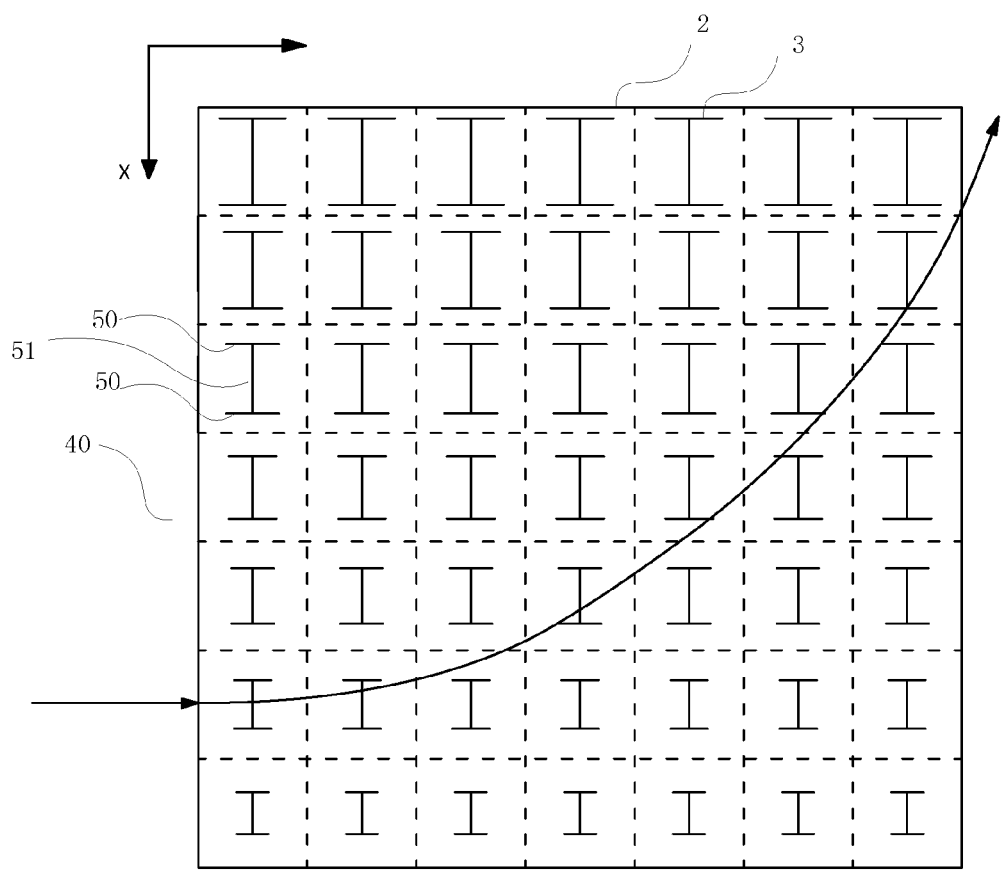
FIG. 13 is a schematic structural view illustrating how the embodiment shown in FIG. 12 deflects a propagation direction of an electromagnetic wave.

When each of the metamaterial unit 40 comprises one man-made microstructure 3 and the man-made microstructures 3 decrease in size gradually in the x direction, the wire contents of the substrate units and, therefore, the refractive indices, also decrease gradually as shown in FIG. 12 and FIG. 13. In this case, the metamaterial units 40 arranged in the y direction have the same size and, therefore, the refractive indices remain constant in the y direction. Of course, in the metamaterial for deflecting an electromagnetic wave of the present disclosure, the refractive indices may also decrease gradually in the y direction according to the same principle as in the x direction, and this is also the case for the z direction.

When the metamaterial units 40 comprise different numbers of man-made microstructures 3 and the man-made microstructures 3 all have the same form and the same size, the metamaterial for deflecting an electromagnetic wave may be designed in such a way that the numbers of man-made microstructures 3 of the metamaterial units decrease gradually to decrease the wire content and, therefore, the refractive indices, gradually. This is also applicable to the y direction and the z direction.

Figure 14:
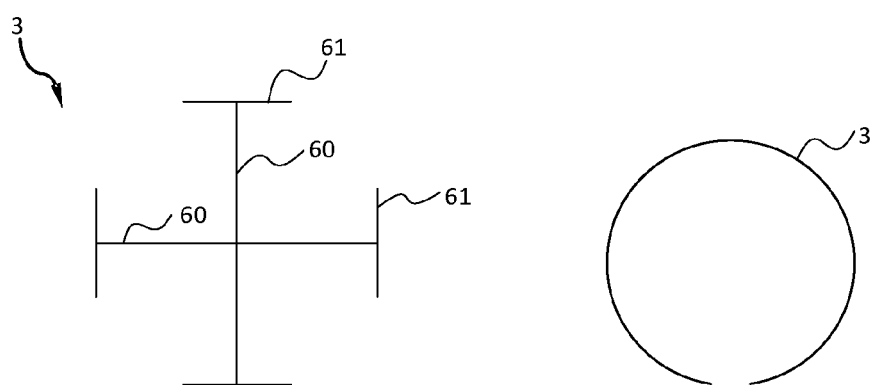
FIG. 14 is a schematic view of a man-made microstructure according to a sixth embodiment of the present disclosure.
Figure 15:
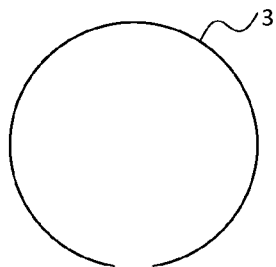
FIG. 15 is a schematic view of a man-made microstructure according to a seventh embodiment of the present disclosure.

The man-made microstructures 3 of the present disclosure may be of any forms. For 2D man-made microstructures 3, they may be of a " 工 " form as shown in FIG. 12 and FIG. 13, which comprises two first metal wires 50 parallel to and equal in length to each other and a second metal 51 connected at both ends thereof to midpoints of the two first metal wires 50 respectively and perpendicular to the two first metal wires 50. The 2D man-made microstructures 3 may also be of a "+" form as shown in FIG. 14, which comprises two long metal wires 60 perpendicularly intersecting with each other and short metal wires 61 connected to two ends of and perpendicular to each of the long metal wires 60. The 2D man-made microstructures 3 may also be an annular ring with a notch as shown in FIG. 15. Of course, any other forms such as a closed or unclosed 2D curve (e.g., a triangular form, a quadrangular form, a "[" form, an elliptical form and so on, can all be used as the pattern of the wires of the man-made microstructures 3 of the present disclosure.

Figure 16:
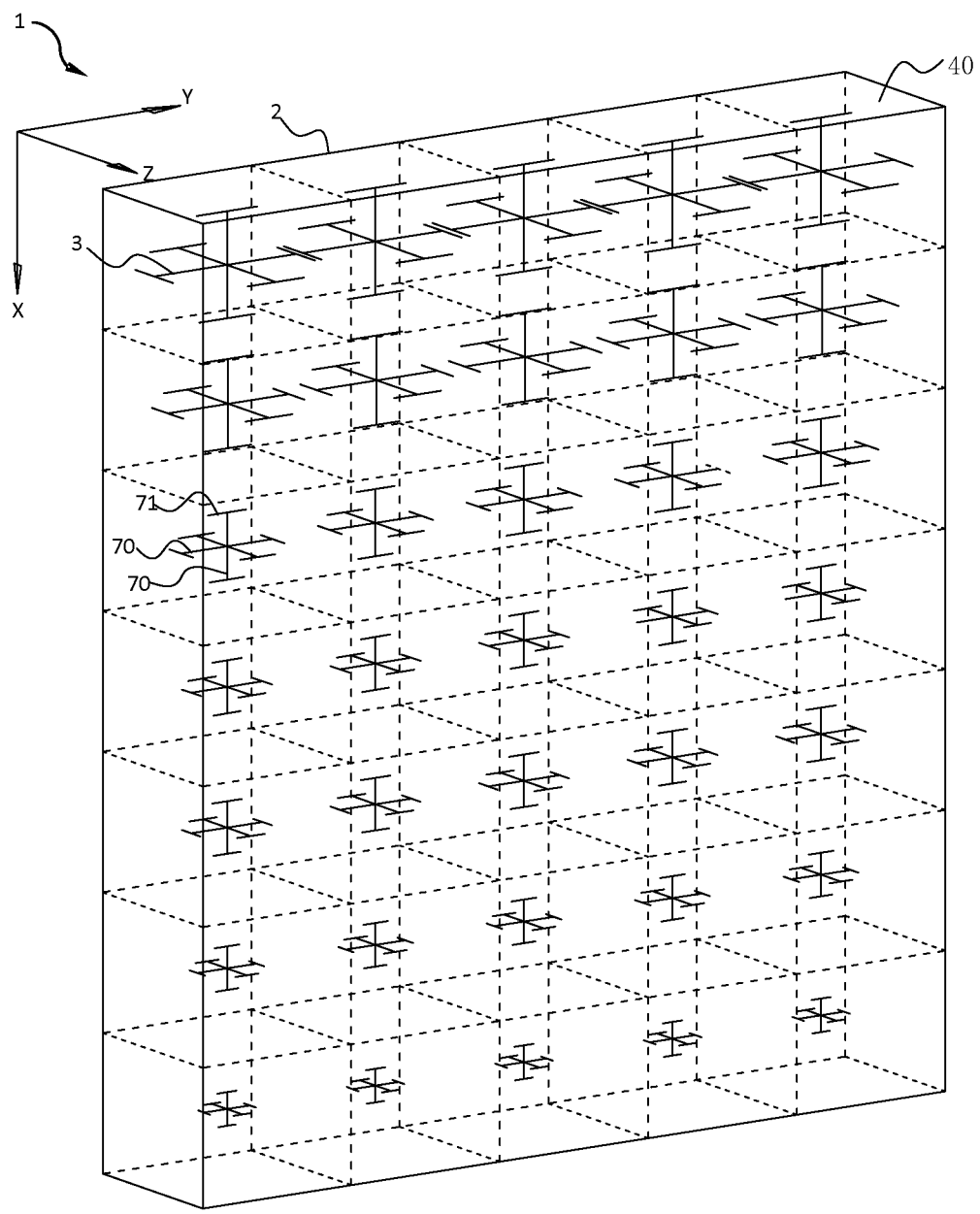
FIG. 16 is a schematic structural view of a metamaterial sheet layer according to an eighth embodiment of the present disclosure.
Figure 17:
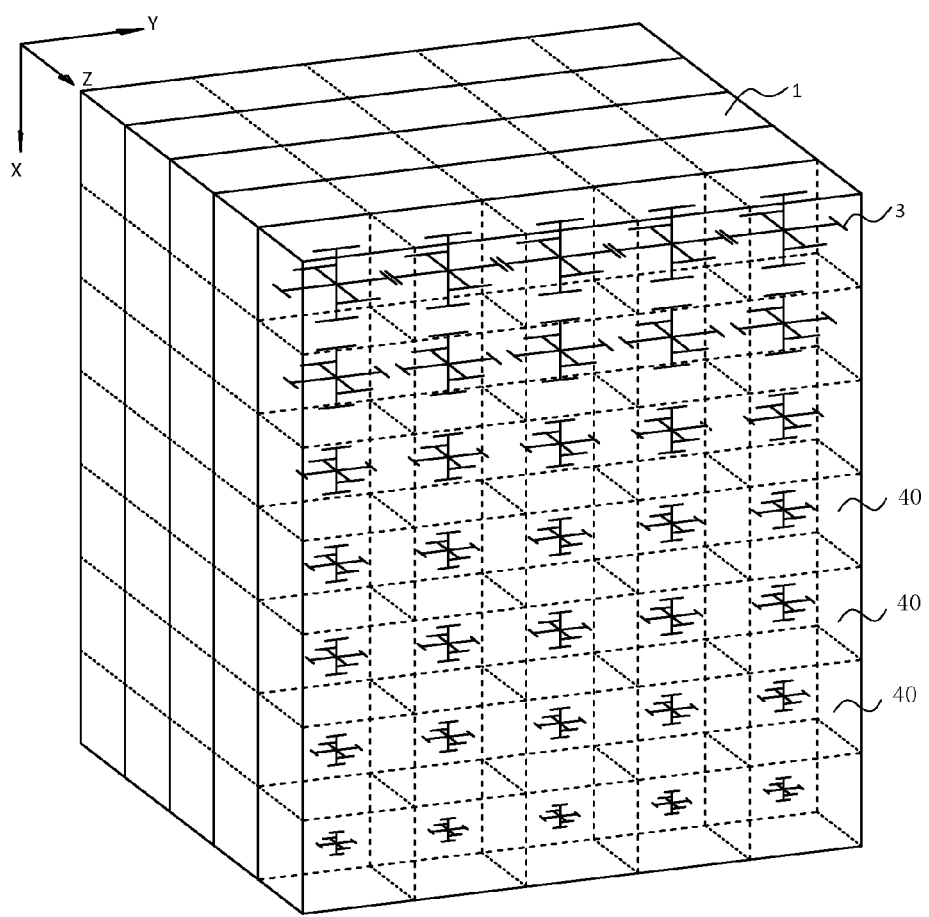
FIG. 17 is a schematic structural view of a metamaterial for deflecting an electromagnetic wave that is obtained by stacking a plurality of metamaterial sheet layers shown in FIG. 16.

For 3D man-made microstructures 3, a preferred embodiment is shown in FIG. 16 and FIG. 17. The metamaterial for deflecting an electromagnetic wave of this embodiment comprises a plurality of identical metamaterial sheet layers 1; that is, the refractive index remains constant in the z direction. For each of the metamaterial sheet layers 1, the refractive indices decrease gradually in the x direction and remains constant in the y direction. As shown in FIG. 16, because each metamaterial unit 40 comprises only one man-made microstructure 3 and all the man-made microstructures 3 have similar forms, the man-made microstructures 3 arranged in an array inside the substrate 2 decrease in size gradually in the x direction and keep unchanged in size in the y direction. Each of the man-made microstructure 3 in this embodiment comprises three orthogonal metal wires 70 perpendicular to each other and intersect with each other at a point and end metal wires 71 perpendicularly connected at both ends of each of the orthogonal metal wires 70 and bisected by the respective orthogonal metal wires 70.

Figure 18:
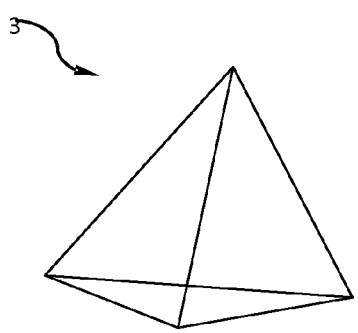
FIG. 18 is a schematic structural view of a man-made microstructure according to a ninth embodiment of the present disclosure.

In other embodiments, the 3D man-made microstructures 3 may also be implemented in many forms, for example, in the form of a regular tetrahedron frame formed by four metal wires connected with each other (as shown in FIG. 18) or any other 3D structures such as any curve in space, a pentagonal prism frame, an annular ring or the like.

It shall be appreciated that, it is not limited that all the man-made microstructures 3 in the metamaterial of the present disclosure necessarily have similar forms; instead, the man-made microstructures 3 may have arbitrary forms different from each other. For example, the metamaterial may comprise both man-made microstructures 3 of the " 工 " form and man-made microstructures 3 of the annular ring form simultaneously.

Additionally, it is unnecessary for the man-made microstructures 3 to be scaled down as in the aforesaid embodiments; instead, the purpose of decreasing the refractive indices gradually may also be achieved by shortening one or more wires of the man-made microstructures gradually to decrease the wire content of the metamaterial units 40 gradually. For example, when all the man-made microstructures are of the " 工 " form, the length of the second metal wire 51 of each column of man-made microstructures may be decreased gradually while the length of the corresponding first metal wire 50 remains unchanged, and the man-made microstructures arranged in the y direction and the z direction are identical to each other. This design can also achieve the purpose of decreasing the refractive indices in the x direction while still keeping the refractive indices unchanged in the y direction and the z direction.

The metamaterial for deflecting an electromagnetic wave of the present disclosure adopts the metamaterial technologies to achieve deflection of the electromagnetic wave. The metamaterial is formed of a plurality of metamaterial sheet layers, and by changing the man-made microstructures of each of the metamaterial sheet layers, refractive indices of corresponding portions can be changed. Therefore, through overall design of the forms and structures of the man-made microstructures, refractive indices that change orderly can be obtained to form a man-made material with nonuniform refractive indices for deflecting the electromagnetic wave. Accordingly, the metamaterial of the present disclosure can satisfy requirements for deflecting various electromagnetic waves through different designs and arrangements of the man-made microstructures.

Preferred embodiments of the present disclosure have been described above with reference to the attached drawings; however, the present disclosure is not limited to the aforesaid embodiments, and these embodiments are only illustrative but are not intended to limit the present disclosure. Those of ordinary skill in the art may further devise many other implementations according to the teachings of the present disclosure without departing from the spirits and the scope claimed in the claims of the present disclosure, and all of the implementations shall fall within the scope of the present disclosure.

What is claimed is:

1. A metamaterial for deflecting an electromagnetic wave, comprising a functional layer, wherein the functional layer comprises a plurality of sheet layers parallel to each other, each of the sheet layers comprises a sheet-like substrate and a plurality of man-made microstructures arranged in an array on the sheet-like substrate, the sheet-like substrate comprises a plurality of unit blocks, each of the man-made microstructures and a corresponding one of the unit blocks occupied thereby form a unit cell, and refractive indices of the unit cells arranged in a first direction in each of the sheet layers vary gradually;
    wherein each of the man-made microstructures is a non-90° rotationally symmetric pattern such that each of the unit cells has an anisotropic electromagnetic parameter; a non-zero angle is formed between an optical axis of each of the unit cells and the first direction.

2. The metamaterial for deflecting an electromagnetic wave of claim 1, wherein the refractive indices of the unit cells arranged in the first direction in each of the sheet layers decrease gradually, the refractive indices of the unit cells arranged in a second direction, which is perpendicular to the first direction, in each of the sheet layers are identical to each other or decrease gradually, and the refractive indices of the unit cells arranged in a third direction, which is perpendicular to a surface of the sheet layer, are identical to each other or decrease gradually.

3. The metamaterial for deflecting an electromagnetic wave of claim 2, wherein the man-made microstructures in each of the sheet layers have a same pattern as each other, sizes of the man-made microstructures arranged in the first direction decrease gradually, sizes of the man-made microstructures arranged in the second direction in each of the sheet layers are identical to each other or decrease gradually, and sizes of the man-made microstructures arranged in the third direction in each of the sheet layers are identical to each other or decrease gradually.

4. The metamaterial for deflecting an electromagnetic wave of claim 3, wherein each of the man-made microstructures is of a two-dimensional (2D) "I" form or a 2D snowflake form.

5. The metamaterial for deflecting an electromagnetic wave of claim 2, wherein each of the man-made microstructures is formed of wires that form a geometric pattern, and both numbers and sizes of the wires attached on the sheet-like substrate decrease gradually in the first direction so that the refractive indices of the unit cells arranged in the first direction in each of the sheet layers decrease gradually.

6. The metamaterial for deflecting an electromagnetic wave of claim 5, wherein all the man-made microstructures are identical to each other, and numbers of the man-made microstructures attached on each of the sheet-like substrates are not totally identical to each other.

7. The metamaterial for deflecting an electromagnetic wave of claim 5, wherein each of the man-made microstructures is of a two-dimensional " $\bot$ " form, which comprises two first metal wires parallel to and equal in length to each other, and a second metal wire connected at both ends to the two first metal wires respectively and perpendicular to the first metal wires.

8. The metamaterial for deflecting an electromagnetic wave of claim 5, wherein each of the man-made microstructures is a "+" form, an annular ring with a notch or a closed curve.

9. The metamaterial for deflecting an electromagnetic wave of claim 5, wherein each of the man-made microstructures is of a 3D structure, which comprises three orthogonal metal wires perpendicular to each other and intersect with each other at a point and end metal wires connected perpendicularly to both ends of each of the orthogonal metal wires respectively.

10. The metamaterial for deflecting an electromagnetic wave of claim 2, wherein optical axes of the unit cells arranged in the first direction in each of the sheet layers are parallel to each other or rotated sequentially with respect to each other.

11. The metamaterial for deflecting an electromagnetic wave of claim 1, wherein a size of each of the unit cells is smaller than one fifth of a wavelength of the electromagnetic wave to be deflected.

12. The metamaterial for deflecting an electromagnetic wave of claim 1, further comprising an impedance matching layer disposed on an incident surface and/or an exiting surface of the functional layer; and the sheet-like substrate is made of a ceramic material, a polymer material, a ferroelectric material or a ferrite material.

* * * * *